United States Patent [19]

Chaffee

[11] 4,015,201
[45] Mar. 29, 1977

[54] ELECTRICAL CONTINUITY AND VOLTAGE TESTING DEVICE

[75] Inventor: Bertram J. Chaffee, Anaheim, Calif.

[73] Assignee: Mono-Probe Corporation, Los Angeles, Calif.

[22] Filed: Dec. 30, 1975

[21] Appl. No.: 645,386

Related U.S. Application Data

[63] Continuation-in-part of Ser. No. 519,747, Oct. 31, 1974, Pat. No. 3,962,630.

[52] U.S. Cl. .................................. 324/51; 324/96; 324/149
[51] Int. Cl.² ...................................... G01R 31/02
[58] Field of Search ............ 324/51, 72.5, 96, 122, 324/133, 149

[56] References Cited

UNITED STATES PATENTS

| | | | |
|---|---|---|---|
| 2,819,448 | 1/1958 | Neeper | 324/149 |
| 3,416,074 | 12/1968 | Schoonover | 324/72.5 X |
| 3,510,766 | 5/1970 | Russell et al. | 324/149 X |
| 3,525,939 | 8/1970 | Cartmell | 324/72.5 X |
| 3,555,420 | 1/1971 | Schwartz | 324/149 |
| 3,673,588 | 6/1972 | Riff | 324/51 X |
| 3,829,763 | 8/1974 | Morin | 324/51 |
| 3,831,089 | 8/1974 | Pearce | 324/133 X |
| 3,840,808 | 10/1974 | Liebermann | 324/149 X |

FOREIGN PATENTS OR APPLICATIONS

| | | | |
|---|---|---|---|
| 2,157,853 | 6/1972 | Germany | 324/149 |
| 2,213,583 | 12/1972 | Germany | 324/96 |

Primary Examiner—James B. Mullins
Attorney, Agent, or Firm—William W. Haefliger

[57] ABSTRACT

A circuit testing device includes a casing, two probes one of which projects from the casing, a voltage level testing circuit operatively connected with one probe and incorporating simple and advantageous circuitry including transistor amplifier means and indicator means, and an electrical continuity testing circuit connected between both the probes.

15 Claims, 8 Drawing Figures

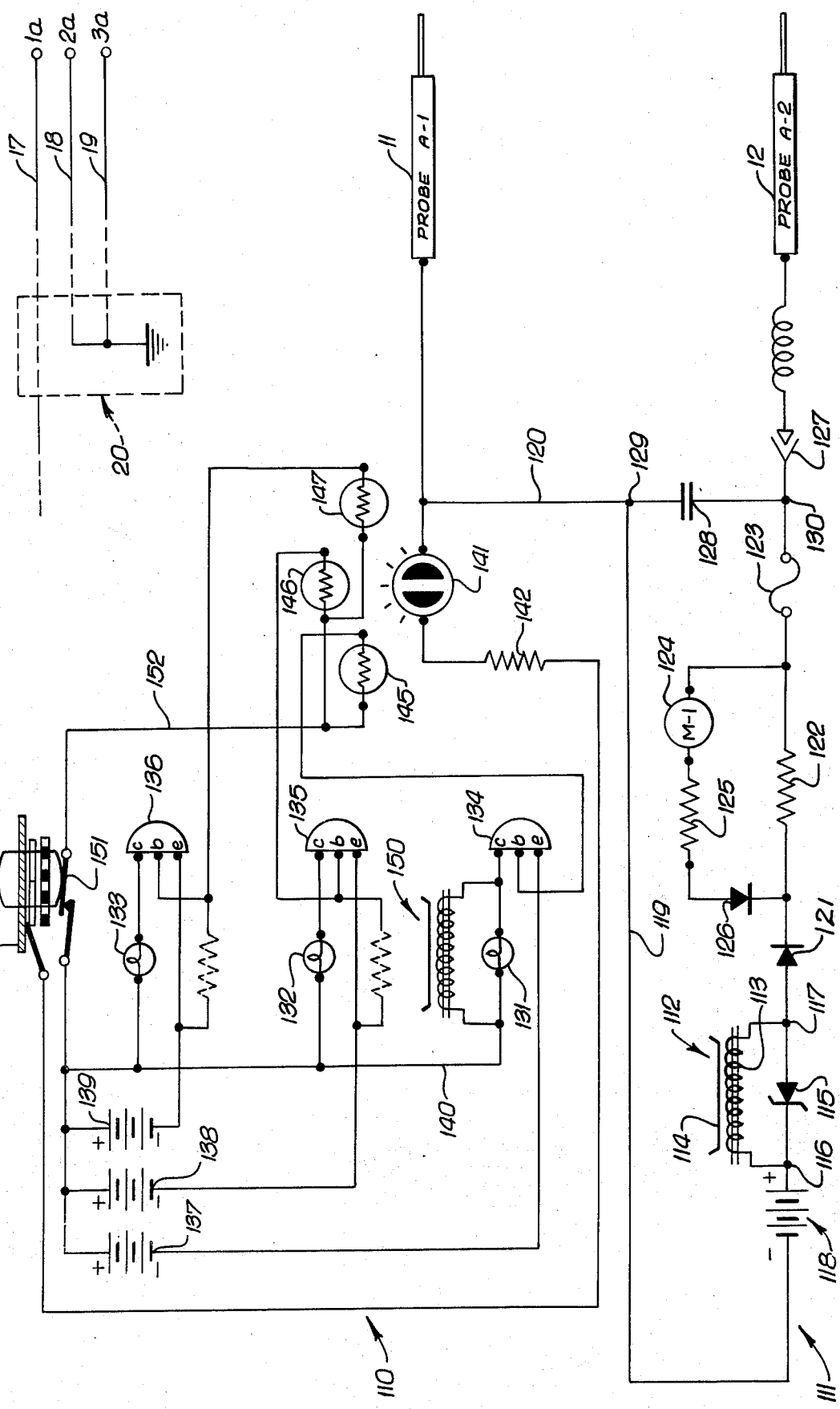

ELECTRICAL CONTINUITY AND VOLTAGE TESTING DEVICE

BACKGROUND OF THE INVENTION

This application is a continuation-in-part of my co-pending application Ser. No. 519,747, filed Oct. 31, 1974, now U.S. Pat. No. 3,962,630.

This invention relates generally to circuit testing devices, and more particularly concerns apparatus to test for voltages and electrical continuity. The invention enables the use of two tester probes to change from continuity testing to voltage testing, no switching devices being required and with the further advantage that no damage or injury can occur to the device or the user. In addition, the presence of 120, 220 and 440 volts can be determined using a single probe, with sound or light indicators being activated, the use of a neutral or ground not being required. A sound indicator is usable to indicate continuity.

Electrical contractors and electricians must frequently determine whether or not voltage is present at a terminal, lead or line, as for example 120, 240 or 480 volts. If the outlet or terminal being tested is difficult to reach, the running of a separate ground line to accomplish the test becomes very difficult. Such workmen also frequently need to know if there is electrical continuity between two terminals; for example, if such continuity is lacking as between neutral and ground terminals at a receptacle, there is the possibility of a break in the neutral wire. Prior devices for resolving these questions have lacked the many unusual advantages in construction, mode of operation and results as are provided by the present invention.

SUMMARY OF THE INVENTION

It is a major object of the invention to provide simple two-probe testing apparatus for testing both voltage and continuity, and overcoming the problems associated with prior devices and providing the advantages referred to. Basically, the device comprises:

a. a casing,
b. two probes, one of which projects from the casing
c. a voltage level testing circuit operatively connected with said one probe, and
d. electrical continuity testing circuitry connected between said two probes.

As will be seen, the continuity testing circuit may include a sounder and energizing battery; the voltage level testing circuit may include multiple voltage level indicators such as lamps which are successively energized as larger voltages are applied to the one probe; and the circuitry to energize the lamps may include amplifiers, photocells and a gas discharge lamp in one form of the invention, and amplifiers and Zener diodes in another form of the invention. A sounder may also be included in the voltage testing circuitry, as will appear.

These and other objects and advantages of the invention, as well as the details of illustrative embodiments, will be more fully understood from the following description and drawings, in which:

DRAWING DESCRIPTION

FIG. 3 is a representative of three wire levels connected to the FIG. 2 terminals; and FIGS. 4–8 are circuit diagrams.

DETAILED DESCRIPTION

Figure 1:
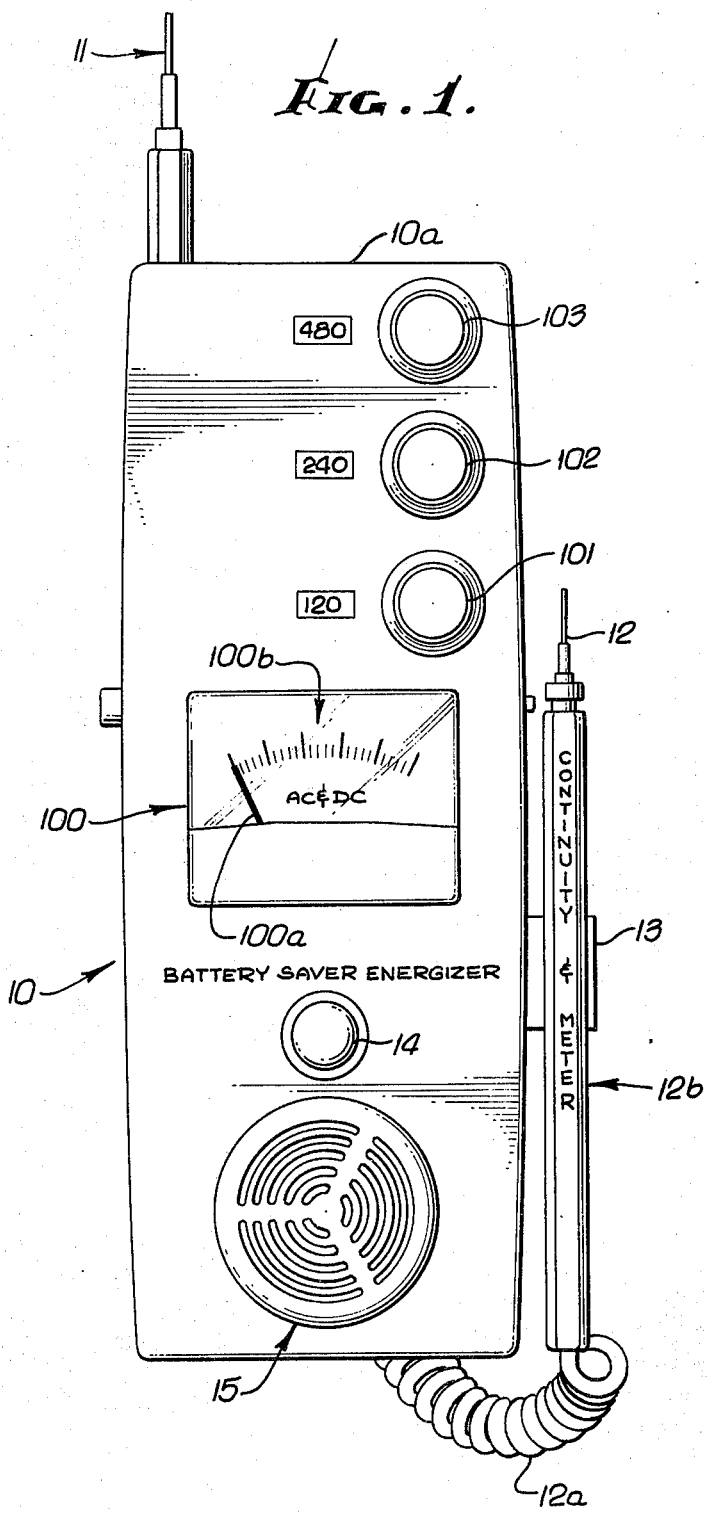
FIG. 1 is a perspective drawing of a testing device embodying the invention.

Referring first to FIG. 1, the portable, insulative housing 10 is elongated, to be hand-carried. Probe 11 which projects from the housing end wall 10a is relatively rigid. A second probe 12 is connected with the housing via flexible cable 12a and its handle 12b may be clip supported at 13 by the housing. The housing also carries a battery saving push-button switch 14, a buzzer or speaker 15, a voltage meter 100 and three lights 101, 102 and 103 to indicate different voltage levels as indicated.

In FIG. 4, the probe 11 is connected with a voltage level testing circuit generally indicated at 110; also electrical continuity testing circuitry 111 is connected between the two probes 11 and 12.

Circuitry 111 includes a sounder 112 which comprises a coil 113 and speaker 114, there being a Zener diode 115 connected across the coil terminals 116 and 117, to establish a fixed voltage across the coil. A battery 118 has its positive terminal connected in series with both the coil and zener diode, via terminal 116, and the battery negative terminal is connected with probe 11 via lead 119 and lead 120. Terminal 117 is connected with probe 12 via diode 121, resistance 122 and fuse 123. A meter 124 is shown as connected in a series branch that includes resistance 125 and diode 126. Probe 12 may be disconnected via jack 127, and a by-pass capacitor 128 is connected as shown between points 129 and 130.

Circuitry 110 include multiple voltage level indicators, as for example lamps or lights 131–133, together with means operatively connected with the indicators to selectively energize them in response to different predetermined voltage levels applied to probe 11. For example, light 131 is illuminated when 120 volts is applied to probe 11; and light 132 is illuminated when 240 volts is applied to probe 11; and light 133 is illuminated with 480 volts is applied to probe 11.

Such selective energizing means includes three amplifiers 134–136, as for example semiconductive devices which have emitter, base and collector electrodes, as indicated. The collectors are shown directly connected with the lamps, and the emitters with negative terminals of batteries 137–139. The battery positive terminals are connected with the lamps via lead 140.

The selective energizing means also includes a gas discharge lamp 141 and electrical resistance 142 connected in series between probe 11 and a common 143 such as a contactor to be touched by the user's finger when switch button 14 is pressed down. Also, three photocells 145–147 are located to be illuminated by radiation from the lamp 141, the photocells being respectively connected with the three amplifiers, as via their base terminals. When 120 volts is applied to probe 11, photocell 145 is activated to switch amplifier 134 to ON, whereby light 131 comes ON. Also, a sounder 150 connected across the lamp 131 emits sound. When 240 volts is applied to probe 11, cell 146 also comes ON, and light 132 comes ON; finally, when 480 volts is applied to probe 11, cell 147 is energized, and lamp 133 comes ON. The lamps 131–133 may have green, yellow and red lenses, to indicate increasing voltage levels. A battery saver switch 151 is activated by push-button 14 to connect all the photocells with energizing batteries 137–139, as via a lead 152.

Figure 5:
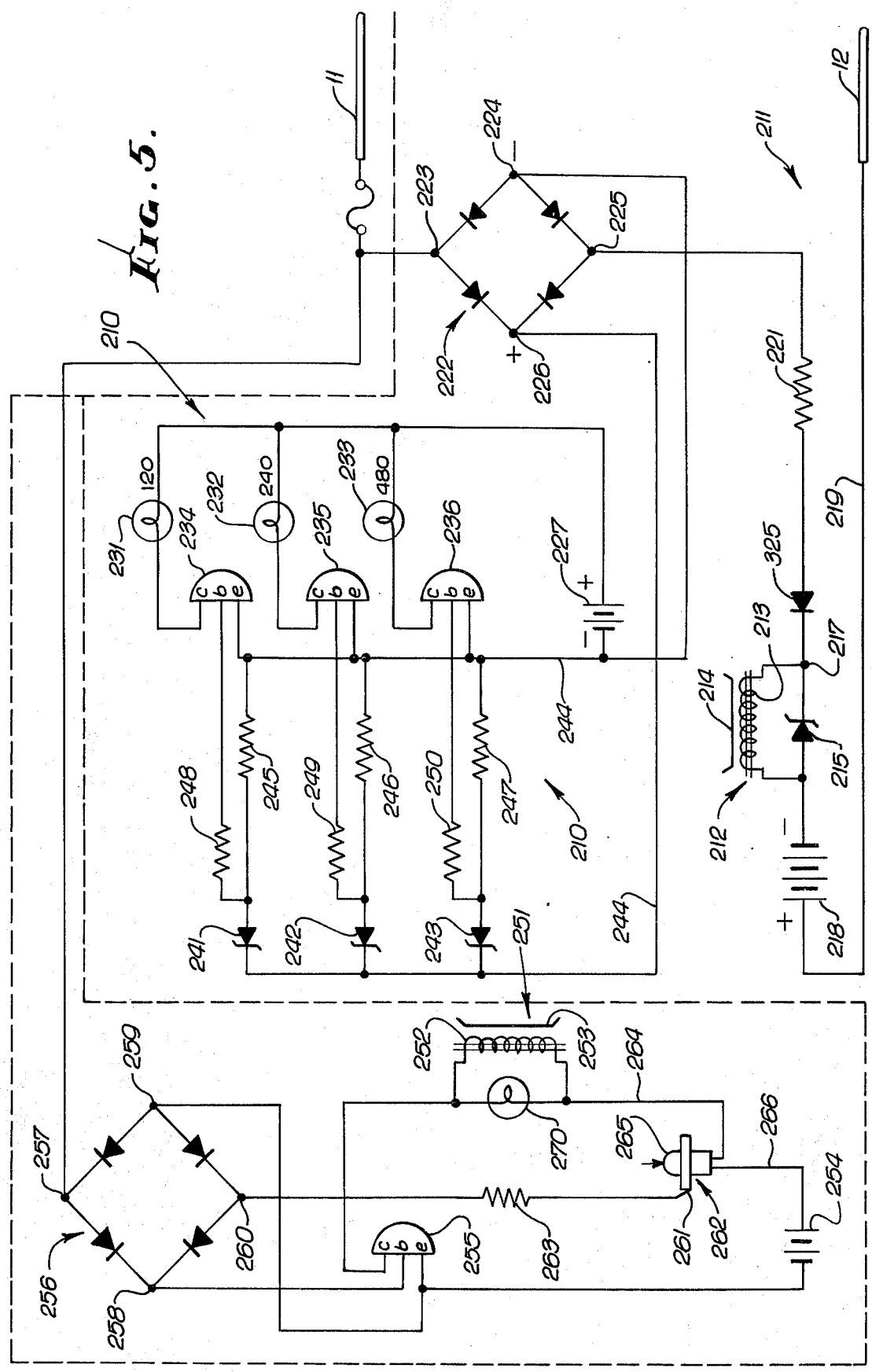

In FIG. 5, the probe 11 is connected with a voltage level testing circuit generally indicated at 210; also, electrical continuity testing circuitry 211 is connected between the two probes 11 and 12.

Circuitry 211 includes a sounder 212 which comprises a coil 213 and speaker 214. Zener diode 215 is connected across the coil to establish a fixed voltage thereacross. Battery 218 has its negative terminal connected in series with both the Zener and the coil, via terminal 216, and the battery positive terminal is connected with probe 12 via lead 219. Probe 11 is connected with the terminal 217 via diode 325, resistor 221 and diode bridge 222. The latter has a junction 223 connected with probe 11, negative junction 224 connected with the negative side of battery 227, junction 225 connected with resistor 221, and positive junction 226.

Circuitry 210 includes multiple voltage level indicators, such as lamps or lights 231–233, together with means operatively connected with the indicators to selectively energize them in response to different predetermined voltage levels applied to probe 11. Thus, lights 231–233 are successively illuminated when 120, 240 and 480 volts are applied to that probe. Selective energization means for the lights includes three amplifiers 234–236, as for example the illustrated semiconductor devices which have emitter, base and collector electrodes, as shown. The collectors are directly connected with the lamps, and the opposite side terminals of the lamps are connected with the positive terminal of battery 227. The lamp emitters are connected with the negative terminal of the same battery.

The selective energization means also includes three Zener diodes 241–243, each connected in series between probe 11 (via bridge junctions 223 and 226) and a common 244 to which the negative terminal of battery 227 is also connected. Resistors 245–247 are also connected with the Zener. The amplifier base terminals are connected with the Zeners, as shown, via resistors 248–250, to voltage control the bases.

Also shown in FIG. 5 is a voltage indicating sounder 251, that includes coil 252 and speaker 253, and an energizing battery 254. A controller, such as semi-conductor device or amplifier 255, effects battery energization of the sounder in response to voltage application to probe 11; thus, a rectifier bridge 256 has a first junction 257 connected with probe 11; second and third junctions 258 and 259 respectively connected with the base and emitter electrodes of the device 255; and a fourth junction 260 connected with a common 261 at the switch 262, as via resistor 263.

The collector terminal of device 255 is connected with the coil 252, the latter also connected with the battery via lead 264, switch button 265, and lead 266. The battery negative terminal is connected to the emitter terminal of device 255. When the push-button 265 is depressed so that the user's finger contacts the common 261, body capacitance of the user is connected via junctions 260 and 258 with the base of device 255, switching it to CONDUCT mode, whereby the sounder will be energized if probe 11 has voltage applied to it. A lamp 270 across the coil 252 will also light up.

Figure 6:
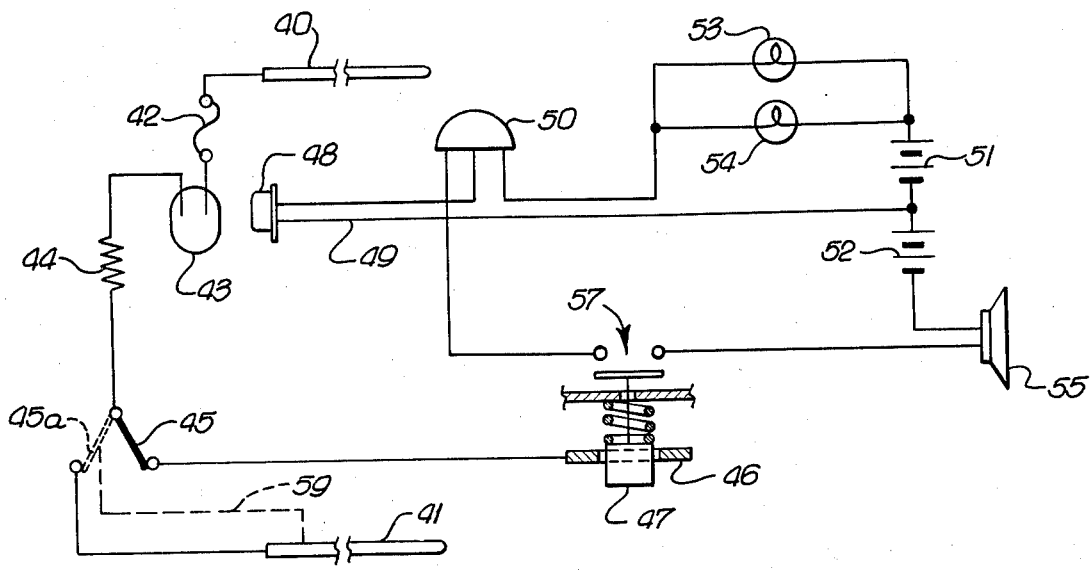

Referring to the composite circuit of FIG. 6, two probes 40 and 41 are used. The circuit includes probe 40, fuse 42, neon lamp 43, resistor 44, switch 45 and grounding ring 46 adjacent push-button 47. In this regard, photo-electric cell 48 controls battery voltage application to base lead 49 of the transistor amplifier 50. Elements connected in the emitter-collector circuit of the transistor amplifier include batteries 51 and 52, parallel connected signal lamps 53 and 54, speaker 55 and switch 57 activated by push-button 47. In operation, when 120 VAC is detected by probe 40, light 53 may come on, and the speaker will sound; and when 240 VAC is detected, light 54 will also come on, and the speaker will sound at a higher intensity level.

The same circuitry is employed for voltage testing, employing both probes 40 and 41. Switch 45 is then moved to alternate position 45a, by hand or automatically as a result of manipulation of probe 41, a switch operating mechanical connection being indicated at 59.

Neon lamp 43 then glows with intensity proportional to voltage application across probes 40 and 41. The voltage at the transistor base is then proportionately controlled to control the battery current operating the lights 53 and 54, and the speaker 55.

In using the device of FIG. 6, single probe 40 may be employed to detect voltage of 120 and 240 volts, eliminating need for a separate ground or neutral test lead. Thus, light 53 comes on for 110 volts, and light 54 comes on for 240 volts (the speaker or buzzer sounds at two different levels, for these voltages). Testing for 440 volts is accomplished by detecting 240 volts on each bus bar or both sides of a receptacle. Both AC and DC may be tested in this way. A test for a broken "neutral" wire may be made as described above.

On a non-grounded fuse block, it is simple to determine with the single probe which is the load wire, and which is the neutral. Fuse testing is made extremely simple by touching the probe to line side of fuse and the load side of fuse. When testing a fuse block or circuit breakers, it is only necessary to touch load size of fuse or breaker when the line size is connected to a bus bar. It is not necessary to look at the tester to determine a voltage indication, as the sound indication will indicate voltage.

Further, when installing a three wire service and one is ready to hook up temporarily to the two wire service, one must determine which is the "hot" wire coming from the pole. The device will determine the hot line. To determine which of the three wires coming from the new service stack is the neutral, one merely uses the continuity probes, touching the stack (ground) with probe 12 and with the other probe 13 checking each new lead until a sound is heard which indicates that particular wire is the neutral, since it is forming a complete circuit from the neutral bus bar around to the grounded stack. Where one is working in broad daylight, it is a great convience not to have to look for a light indication, knowing that the sound indicator indicates that voltage or continuity is present.

Other applications include establishing neutrals; ground; motors; controls; relays, primary and secondary sides of transformers for voltages and continuity; continuity phasing pairs in motors for 120, 240 and 480 volts; switchboard tests for low and high voltage; relays, low and high voltage; telephones, testing systems via sound and single probe; testing single phase and three phase windings of motors.

The device is usable when no ground is available, and an outlet terminal (which may be quite inaccessible as in an attic, under a floor, etc.) is not operative. The single probe can then be applied to the terminal or wire to determine if it is hot.

Figure 7:
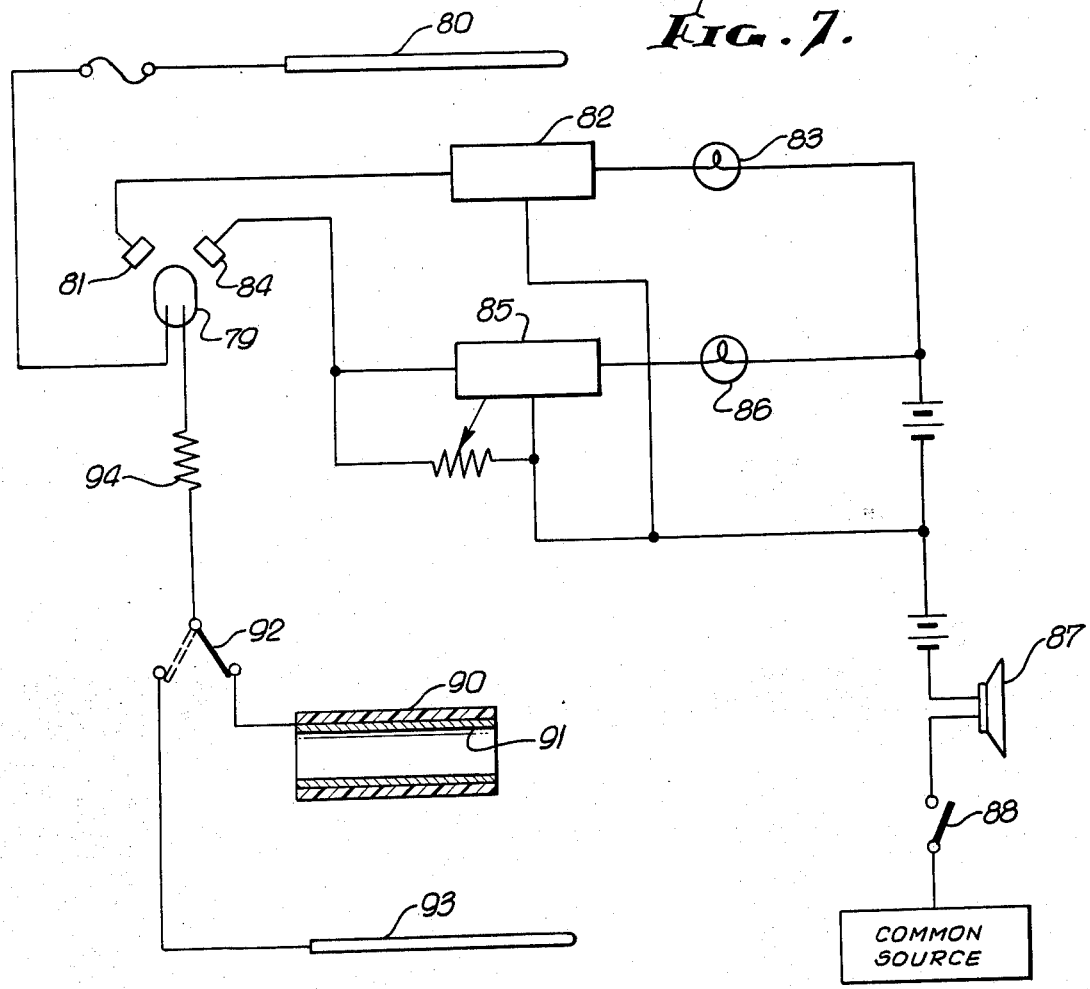

The FIG. 7 device is similar to that of FIG. 6, but varies in that two sensors and two amplifiers are used. Thus, relatively low voltage (say 120 VAC) applied to probe 80 activates sensor 81 (via Neon tube 79) and the output of the sensor is amplified at 82 to cause light indicator 83 to glow; and relatively higher voltage (say 240 VAC) applied to probe 80 activates sensor 84 the output of which is amplified at 85 to cause light indicator 86 to glow (in addition to glow of sensor 83). Either voltage will cause the sound transducer such as speaker 87 to operate. A turn-on switch is seen at 88.

Isolation of the user's body is achieved by providing an electrically insulative layer 90 over the outer surface of the cylindrical metallic housing 91 which contains the described circuitry. Switch 92 is movable between the voltage reading position shown in full lines, in which it is in electrical series with the housing 91, resistor 94 and tube 79, and the alternate position 92a, in which it is connected with the second probe 93.

Figure 2:
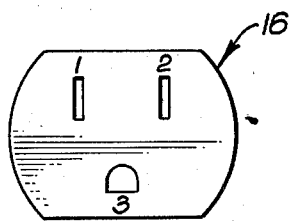
FIG. 2 is a representation of a plug-in receptacle.

Extending the description to FIG. 2, the rigid probe 11 may be inserted into any of the openings 1, 2 and 3 of the electrical plug-in type receptacle 16, by urging the housing toward the front of the receptacle. With the push-button 14 depressed, the buzzer 15 will respond to indicate the presence of voltage, as for example 120, 240 or 480 volts as the case may be. Corresponding lights 101–103 also will light and the needle 100a of meter will move to register such voltage on dial face 100b. Merely as illustrative, FIG. 3 shows opening 1 containing a terminal 1a connected with the hot line 17, and openings 2a and 3a connected with lines 18 and 19 connected to ground at a remote panel 20, for example.

Figure 8:
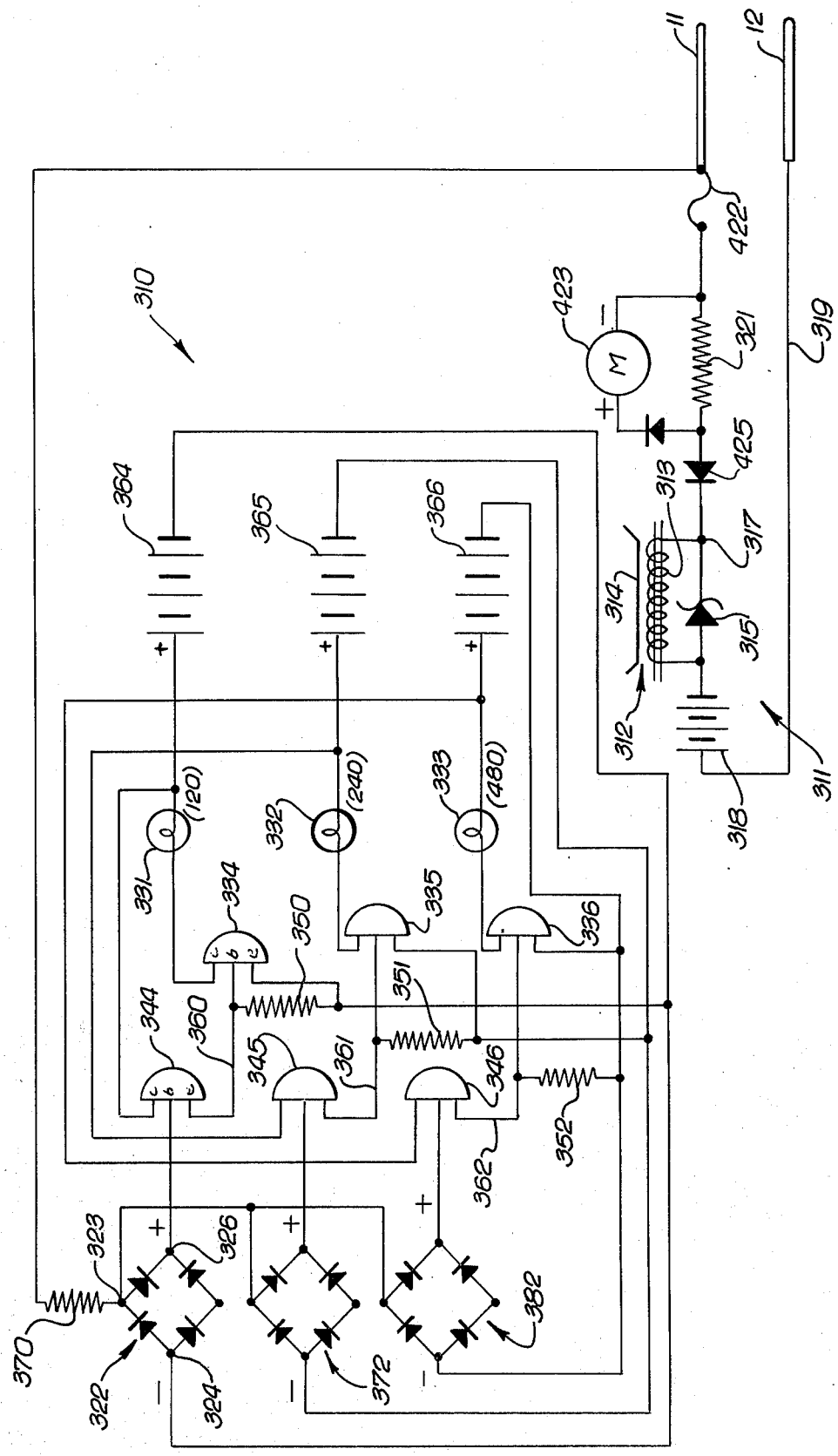

In FIG. 8, the probe 11 is connected with a voltage level testing circuit generally indicated at 310; also electrical continuity testing circuitry 311 is connected between probes 11 and 12.

Circuitry 311 includes elements 312–315, 317–319, 321 and 425 corresponding to elements 212–215, 217–219, 221 and 325 in FIG. 5. Probe 11 is directly connected with resistor 321, via fuse 322, and a meter 423 is connected across resistor 321 to indicate the presence of current through same.

Circuitry 310 includes multiple voltage level indicators, such as three lamps or lights 331–333, together with means operatively connected with the indicators to selectively energize them in response to different predetermined voltage levels applied to probe 11. For example, lights 331–333 are successively illuminated with 120, 240 and 480 volts are applied to that probe. Selective energization means for the lights includes three amplifiers, each including primary and secondary transistors, each of the latter having base, emitter and collector electrodes, as shown. Thus, the amplifier for light 331 includes the primary and secondary transistors 344 and 334; the amplifier for light 332 includes the primary and secondary transistors 345 and 335; and the amplifier for light 333 includes primary and secondary transistors 346 and 336. Each primary transistor is connected in controlling relation with its associated secondary transistor, as via the emitter to base connections 360–362; DC voltage means such as the 9-volt batteries 364–366 are respectively connected in series with the emitter-collector indicator circuits of the transistor in each of the three amplifiers, and resistances 350–352 are respectively connected between the emitters of the transistors 344–346 and the negative terminals of the batteries. The values of the resistors vary to enable successive turn-on of the lights as the voltage on probe 11 is raised to the values discussed.

The one probe 11 is electrically connected with the base electrode of each of the transistors 344–346, as for example via the respective diode bridges 322, 372 and 382, as shown. The bridges are alike; each bridge has a first junction (see 323 for bridge 322) connected with the probe 11, as via resistor 370; the bridges have second junctions (see 326 for bridge 322) respectively connected with the base electrodes of the primary transistors; and the bridges have third junctions (see 324 for bridge 322) respectively connected with the battery negative terminals.

In the simpler device of FIG. 8, no body contact, as via a switch, is required; also, the brightness of the indicator lights is substantially enhanced over that of FIG. 5.

The transistors may each be identified by the designations 2N6426, and the resistors 350, 351 and 352 may have the values 900 ohms, 3,000 ohms and 11,000 ohms, respectively. These values are representative, only, and others may be used.

I claim:
1. In a circuit testing device,
   a. a casing,
   b. two probes, one of which projects from the casing
   c. a voltage level testing circuit operatively connected with said one probe, and
   d. electrical continuity testing circuitry connected between said two probes,
   e. said voltage level testing circuit including voltage level indicator means, transistor amplifier means connected with the indicator means to energize same in response to different voltages applied to said one probe, the indicator means connected in the emitter-collector circuitry of the transistor amplifier means, said one probe operatively coupled to the base electrode of said transistor amplifier means, and DC voltage means directly connected with the emitter-collector circuitry of said transistor amplifier means.

2. The device of claim 1 wherein said electrical continuity testing circuitry includes a sounder.

3. The device of claim 2 wherein the sounder includes a coil and said electrical continuity testing circuitry includes a Zener diode connected across said coil, and a battery connected in series with said diode and coil.

4. The device of claim 3 wherein the electrical continuity testing circuitry includes a meter connected in series with said coil and Zener diode.

5. The device of claim 2 wherein said electrical continuity testing circuitry includes a diode bridge connected in series between said one probe and said sounder in said continuity testing circuitry, said bridge also connected in series with said transistor amplifier means in said voltage level testing circuit.

6. The device of claim 1 wherein said indicator means includes multiple voltage level indicators.

7. The device of claim 6 wherein there are three of said indicators, and said transistor amplifier means includes three amplifiers respectively connected with said indicators to selectively energize same in response to 120, 240 and 480 volts respectively applied to said one probe.

8. The device of claim 7 wherein said voltage level testing circuit includes a gas discharge lamp and electrical resistance connected in series between said one probe and a common, and three photocells located to be illuminated by radiation from said lamp, said photocells respectively connected with the three amplifiers.

9. The device of claim 7 wherein said voltage level testing circuit includes three Zener diodes each connected in series between said one probe and a common, said amplifiers respectively connected with the three Zener diodes to be responsive to different voltage levels established by said Zener diodes.

10. The device of claim 9 wherein said voltage level testing circuit includes a sounder and a battery, and a controller connected with said battery and sounder and energizable in response to voltage application to said one probe to effect battery energization of said sounder.

11. The device of claim 10 including a switch connected in series between said battery and sounder.

12. The device of claim 10 wherein the controller comprises a semiconductor having base, emitter and collector terminals, and said voltage level testing circuit includes a rectifier bridge having a first junction connected with said one probe, second and third junctions connected with said base and emitter terminals, and a fourth junction connected with a common at the switch, the collector terminal connected with the sounder.

13. The device of claim 7 wherein each of said amplifiers includes primary and secondary transistors each having base, emitter and collector electrodes, the primary transistor connected in controlling relation with the secondary transistor, each indicator connected in the emitter-collector circuit of the secondary transistor, the one probe electrically connected with the base electrode of each primary transistor, DC voltage means connected in series with the emitter-collector circuit of each transistor, and a resistor connected between the emitter and said DC voltage means.

14. The device of claim 13 wherein the voltage level testing circuit includes three diode bridges each having a first junction connected with said one probe, the bridges having second junctions respectively connected with the base electrodes of the primary transistors, and the bridges having third junctions respectively connected with the DC voltage means.

15. In a circuit testing device,
 a. a casing,
 b. two probes, one of which projects from the casing,
 c. a voltage level testing circuit operatively connected with said one probe, and
 d. electrical continuity testing circuitry connected between said two probes,
 e. said voltage level testing circuit including voltage level indicator means, amplifier means connected with the indicator means to energize same in response to different voltages applied to said one probe, the amplifier means including primary and secondary transistor means, the primary transistor means connected in controlling relation with the secondary transistor means, the indicator means connected in the emitter-collector circuit of the secondary transistor means, diode bridge means having a first junction connected with the one probe and a second junction connected with the base electrode of the primary transistor means, and DC voltage means connected with a junction of said bridge means and also connected with the emitter-collector circuits of said primary and secondary transistor means.

* * * * *